(12) United States Patent
Nam

(10) Patent No.: US 8,891,307 B2
(45) Date of Patent: Nov. 18, 2014

(54) NONVOLATILE MEMORY DEVICE AND MEMORY SYSTEM INCLUDING THE SAME

(75) Inventor: Sang-Wan Nam, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 158 days.

(21) Appl. No.: 13/620,002

(22) Filed: Sep. 14, 2012

(65) Prior Publication Data
US 2013/0188423 A1    Jul. 25, 2013

(30) Foreign Application Priority Data
Jan. 19, 2012  (KR) .................. 10-2012-0006099

(51) Int. Cl.
*G11C 16/04* (2006.01)
(52) U.S. Cl.
CPC ............ *G11C 16/0483* (2013.01); *G11C 16/04* (2013.01)
USPC .................................................... 365/185.17
(58) Field of Classification Search
CPC .... G11C 16/0483; G11C 16/10; G11C 16/04; H01L 27/115
USPC .................................................... 365/185.17
See application file for complete search history.

(56) References Cited

U.S. PATENT DOCUMENTS

| 8,133,784 | B2 | 3/2012 | Chung et al. | |
|---|---|---|---|---|
| 8,570,806 | B2* | 10/2013 | Lee .......................... | 365/185.17 |
| 2010/0039865 | A1 | 2/2010 | Kidoh et al. | |
| 2010/0195395 | A1 | 8/2010 | Jeong et al. | |
| 2010/0248439 | A1 | 9/2010 | Chung et al. | |
| 2011/0002178 | A1 | 1/2011 | Hwang et al. | |
| 2011/0019486 | A1 | 1/2011 | Jang et al. | |
| 2011/0051527 | A1 | 3/2011 | Kirisawa et al. | |
| 2011/0216603 | A1* | 9/2011 | Han et al. ................. | 365/185.23 |

FOREIGN PATENT DOCUMENTS

| KR | 100673019 B1 | 1/2007 |
|---|---|---|
| KR | 20100089022 A | 8/2010 |
| KR | 20100107661 A | 10/2010 |
| KR | 20100119165 A | 11/2010 |
| KR | 1020110003764 U | 1/2011 |

* cited by examiner

*Primary Examiner* — Hoai V Ho
*Assistant Examiner* — Tri Hoang
(74) *Attorney, Agent, or Firm* — Harness, Dickey & Pierce, P.L.C.

(57) ABSTRACT

According to example embodiments of inventive concepts, a nonvolatile memory device includes a first NAND string and a second NAND string. The first NAND string include a first string selection transistor, a first ground selection transistor having a threshold voltage higher than a threshold voltage of the first string selection transistor, and first memory cells stacked on a substrate. The a second NAND string includes a second string selection transistor, a second ground selection transistor having a threshold voltage higher than a threshold voltage of the second string selection transistor, and second memory cells stacked on the substrate. A first selection line may connect the first string selection line and the first ground selection line, and a second selection line may connect the second selection line and the second ground selection line. The first and second selection lines may be electrically isolated from each other.

13 Claims, 16 Drawing Sheets

NONVOLATILE MEMORY DEVICE AND MEMORY SYSTEM INCLUDING THE SAME

CROSS-REFERENCE TO RELATED APPLICATIONS

This patent application claims priority under 35 U.S.C §119 to Korean Patent Application No. 10-2012-0006099, filed on Jan. 19, 2012, the entire disclosure of which is incorporated by reference herein.

BACKGROUND

Example embodiments of inventive concepts relate to a semiconductor memory device, and more particularly, to a nonvolatile memory device and/or a memory system including the nonvolatile memory device.

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device is roughly divided into a NOR type and a NAND type.

SUMMARY

According to example embodiments of inventive concepts, a nonvolatile memory device includes a first NAND string, a second NAND string, a first selection line, and a second selection line. The first NAND string includes a first string selection transistor, a first ground selection transistor having a threshold voltage that is higher than a threshold voltage of the first string selection transistor, and first memory cells stacked on a substrate. The second NAND string includes a second string selection transistor, a second ground selection transistor having a threshold voltage higher that is higher than a threshold voltage of the second string selection transistor, and second memory cells stacked in on the substrate. The first selection line is connected to the first string selection transistor by a first sting selection line. The first selection line is connected to the first ground selection transistor by a first ground selection line. The second selection line is electrically isolated from the first selection line. The second selection line is connected to the second string selection transistor by a second string selection line. The second selection line is connected to the second ground selection transistor by a second ground selection line.

The device may further include a plurality of word lines connected to the first memory cells and the second memory cells, and a driver circuit configured to provide a power supply voltage and a read voltage to at least one of the first memory cells and at least one of the second memory cells through an unselected word line of the plurality of word lines. A threshold voltage of the first ground selection transistor may be higher than the power supply voltage and lower than the read voltage provided to the unselected word line. A threshold voltage of the second ground selection transistor may be higher than the power supply voltage and lower than the read voltage provided to the unselected word line.

The device may further include a global ground selection line. The first NAND string may include a first global ground selection transistor and the second NAND string may include a second global ground selection transistor. The global ground selection line may connect the first and second global ground selection transistors.

A first word line may electrically connect the first and second memory cells.

A first word line may electrically connected one of the first memory cells and one of the second memory cells at a common height.

The nonvolatile memory device may further include a selection line driver configured to selectively provide a bias voltage to the first and second selection lines. The selection line driver may include first and second path transistors, the first selection line being connected to the first path transistor and the second selection line being connected to the second path transistor.

According to example embodiments of inventive concepts, a nonvolatile memory device may include first memory cells between a first ground selection transistor and a first string selection transistor stacked on a substrate, a first path transistor and a second path transistor. A threshold voltage of the first ground selection transistor is higher than a threshold voltage of the first string selection transistor. A threshold voltage of the second ground selection transistor is higher than a threshold voltage of the second string selection transistor. The first path transistor is configured to provide an operation voltage to the first string selection transistor and the first ground selection transistor. The second path transistor is configured to provide the operation voltage to the second string selection transistor and the second ground selection transistor.

The device may further include a plurality of word lines connected to the first memory cells and the second memory cells, and a driver circuit including the first and the second path transistors. The driver circuit may be configured to provide a power supply voltage and a read voltage to at least one of the first memory cells and at least one of the second memory cells through an unselected word line of the plurality of word lines. A threshold voltage of the first ground selection transistor may be higher than the power supply voltage and lower than the read voltage provided to the unselected word line. A threshold voltage of the second ground selection transistor may be higher than the power supply voltage and lower than the read voltage provided to the unselected word line.

The first ground selection transistor may be configured to be turned off at a program operation.

The first string selection transistor may be configured to be turned on at a program operation.

According to example embodiments of inventive concepts, a nonvolatile memory device may include a plurality of memory cells configured to store data, a first selection transistor connected between a bit line and the plurality of memory cells, and a second selection transistor connected between the plurality of memory cells and a common source line. The second selection transistor may have a threshold voltage that is different than a threshold voltage of the first selection transistor.

The device may further include a substrate, wherein the plurality of memory cells, the first selection transistor, and the second selection transistor are vertically stacked on the substrate.

The first and second selection transistor may be electrically connected.

The device may be configured to apply an identical bias voltage to the first and second selection transistors.

A threshold voltage of the second selection transistor may be higher than a threshold voltage of the first selection transistor.

According to example embodiments of inventive concepts, a nonvolatile memory device includes at least one bit line, a common source lines, and at least one NAND string connected to the common source line. The at least one NAND string includes a plurality of memory cells that are sequentially stacked, a first selection transistor connected to one of the at least one bit line and the plurality of memory cells, and a second selection transistor having a threshold voltage that is different than a threshold voltage of the first selection transistor. The second selection transistor includes a gate that is electrically connected to a gate of the first selection transistor.

The at least one NAND string may further include a third selection transistor between the second selection transistor and the common source line.

The nonvolatile memory device may further include a driver circuit including 1 to M first path transistors. The nonvolatile memory device may include M rows by N columns of the NAND strings connected to the common source line, M and N each independently being integers greater than 1, and N bit lines. Each of the N bit lines may connect M NAND strings in common along one of the N columns of the M rows by N columns of the NAND strings, and each of the 1 to M first transistors of the driver circuit may be configured to apply at least one operation voltage to the first selection transistor and the second selection transistor of N NAND strings along of the M roses of the M rows by N columns of the NAND strings.

The nonvolatile memory device may further include 1 to K word lines, wherein K is an integer greater than 1, and each of the 1 to K word lines is connected to one of the plurality of memory cells at a common level in each of the M rows by N columns of the NAND strings.

According to example embodiments of inventive concepts, an electronic device may include at least one of the foregoing nonvolatile memory device and a memory controller connected to the at least one nonvolatile memory device. The memory controller may be configured to control at least one operation of the at least one nonvolatile memory device.

BRIEF DESCRIPTION OF THE FIGURES

The above and other objects and features will become apparent from the following description with reference to the following figures, wherein like reference numerals refer to like parts throughout the various figures unless otherwise specified, and wherein.

Figure 1:
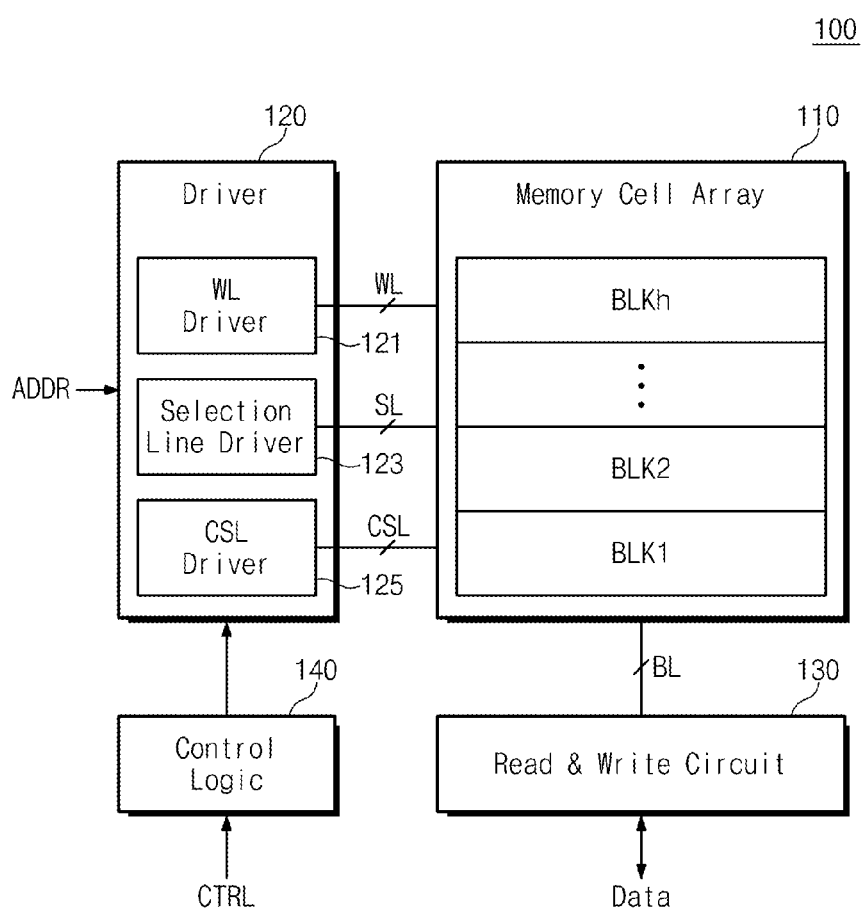
FIG. 1 is a block diagram schematically illustrating a nonvolatile memory device according to example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of like reference numbers in the various drawings is intended to indicate the presence of like elements or features throughout the different views.

DETAILED DESCRIPTION

Example embodiments of inventive concepts will be described more fully hereinafter with reference to the accompanying drawings, in which some example embodiments of inventive concepts are shown. Example embodiments of inventive concepts may, however, be embodied in many different forms and should not be construed as limited to the embodiments set forth herein. Rather, these embodiments are provided so that this disclosure will be thorough and complete, and will fully convey the scope of inventive concepts to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

FIG. 1 is a block diagram schematically illustrating a nonvolatile memory device according to example embodiments of inventive concepts. Referring to FIG. 1, a nonvolatile memory device 100 may include a memory cell array 110, a driver 120, a read/write circuit 130, and control logic 140.

The memory cell array 110 may be connected to the driver 120 via word lines WL and to the read/write circuit 130 via bit lines BL. The memory cell array 110 may include a plurality of memory cells. In example embodiments, memory cells arranged in a row direction may be connected to the word lines WL. Memory cells arranged in a column direction may be connected to the bit lines BL. The memory cells in the memory cell array 110 may be configured to store one or more bits per cell.

The memory cell array 110 may include a plurality of memory blocks BLK1 to BLKh, each of which includes a plurality of memory cells. Each of the memory blocks BLK1 to BLKh may include a plurality of word lines WL, a plurality of string selection lines SSL, a plurality of ground selection lines GSL, and at least one common source line CSL.

The driver 120 may be connected to the memory cell array 110 via the word lines WL. The driver 120 may be configured to operate responsive to the control of the control logic 140. The driver 120 may receive an address ADDR from an external device (not shown).

The driver 120 may be configured to decode the input address ADDR. The driver 120 may select word lines WL, string selection lines SSL, ground selection lines GSL, and a common source line CSL using the decoded address.

The driver 120 may include a word line driver 121, a selection line driver 123, and a common source line driver 125.

The word line driver 121 may provide voltages to selected and unselected word lines, respectively. For example, at programming, erasing, or reading, the driver 120 may provide the word lines with a program operation voltage associated with a program operation, a read operation voltage associated with a read operation, or an erase operation voltage associated with an erase operation. For example, the word line driver 121 may be configured to select the word lines and to provide operation voltages to the word lines.

The selection line driver 123 may be configured to select the selection lines SL and to provide operation voltages to the selection lines SL. That is, the selection line driver 123 may select string selection lines SSL and ground selection lines GSL to provide operation voltages according to a selection result.

The common source line driver 125 may provide an operation voltage to the common source line CSL.

The read/write circuit 130 may be connected to the memory cell array 110 via the bit lines BL. The read/write circuit 130 may operate responsive to the control of the control logic 140. The read/write circuit 130 may select the bit lines BL.

In example embodiments, the read/write circuit 130 may receive data from the outside of the nonvolatile memory device 100 to write it in the memory cell array 110. The read/write circuit 130 may read data from the memory cell array 110 to transfer it to the external device. The read/write circuit 130 may read data from a first storage area of the memory cell array 110 to write it in a second storage area of the memory cell array 110. For example, the read/write circuit 130 may be configured to support a copy-back operation.

In example embodiments, the read/write circuit 130 may include elements such as a page buffer, (or, a page register), a column selector, a data buffer, and the like. The read/write circuit 130 may include elements such as a sense amplifier, a write driver, a column selector, a data buffer, and the like.

The control logic 140 may be connected to the driver 120 and the read/write circuit 130. The control logic 140 may be configured to control an overall operation of the nonvolatile memory device 100. The control logic 140 may operate responsive to a control signal CTRL provided from the external device.

Figure 2:
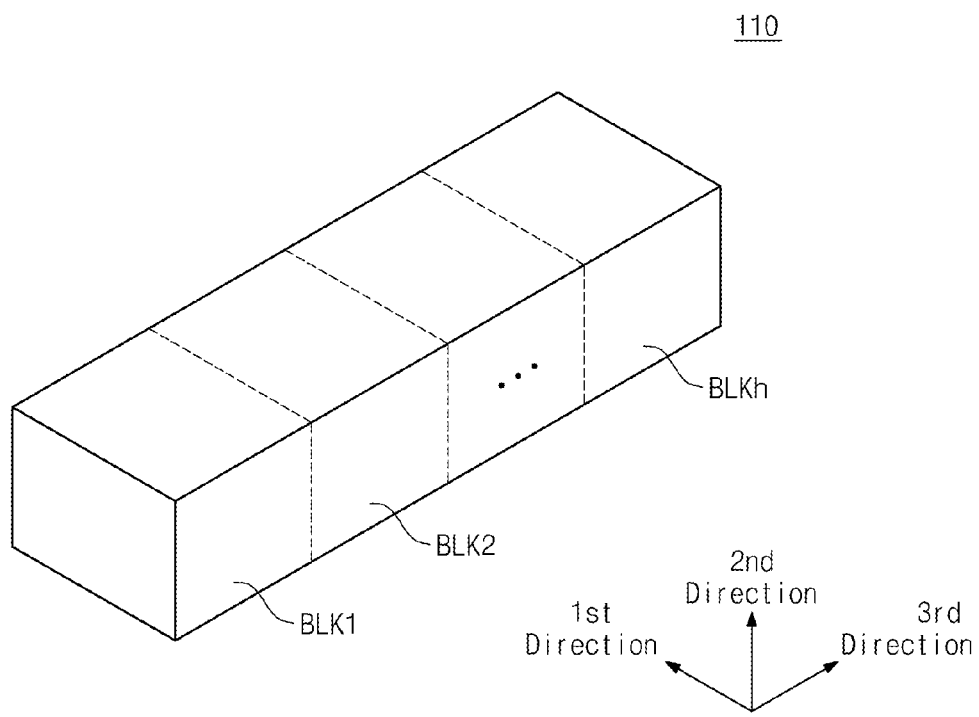
FIG. 2 is a diagram schematically illustrating a memory cell array in FIG. 1 according to example embodiments of inventive concepts.

FIG. 2 is a diagram schematically illustrating a memory cell array in FIG. 1 according to example embodiments of inventive concepts. Referring to FIG. 2, a memory cell array 110 may include a plurality of memory blocks BLK1 to BLKh, each of which is formed to have a three-dimensional structure (or, a vertical structure). For example, each of the memory blocks BLK1 to BLKh may include structures extending along first to third directions. Although not shown in FIG. 2, each of the memory blocks BLK1 to BLKh may include a plurality of NAND strings extending along the second direction. For example, a plurality of NAND strings NS may be provided along the first and third directions.

Each NAND string NS may be connected to a bit line, a string selection line, a ground selection line, word lines, and a common source line. That is, each memory block may be connected to a plurality of bit lines, a plurality of string selection lines, a plurality of ground selection lines, and a plurality of common source lines. Each memory block will be more fully described with reference to FIG. 3.

Figure 3:
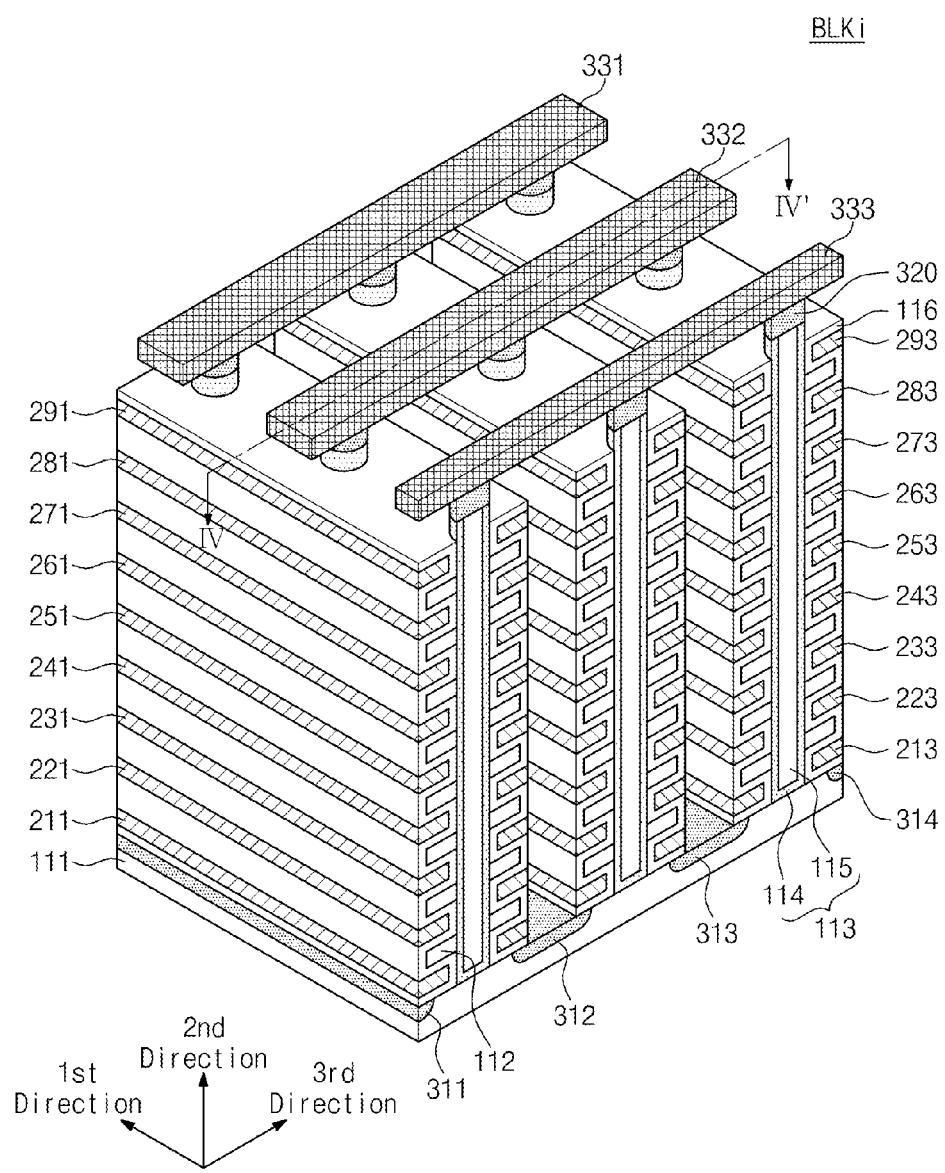
FIG. 3 is a perspective view of a part of a memory block in FIG. 2 according to example embodiments of inventive concepts.

FIG. 3 is a perspective view of a part of a memory block in FIG. 2 according to example embodiments of inventive concepts, and FIG. 4 is a cross-sectional view taken along a line IV-IV' of FIG. 3. Referring to FIGS. 3 and 4, a memory block BLKi may include structures that extend along first to third directions.

First, a substrate 111 may be provided. In example embodiments, the substrate 111 may include a silicon material doped with a first-type impurity. For example, the substrate 111 may be a silicon material doped with a p-type impurity. For example, the substrate 111 may be a p-well (or, a pocket p-well). Below, it is assumed that the substrate 111 is p-type silicon. However, the substrate 111 is not limited thereto.

A plurality of wells 311 to 314 extending along the first direction may be provided at the substrate 111. For example, a plurality of wells 311 to 314 may be second-type wells different from the substrate 111. For example, the wells 311 to 314 may be n-type wells. Hereinafter, it is assumed that the wells 311 to 314 are n-wells (referred to as first to fourth n-wells). However, the wells 311 to 314 are not limited thereto.

On the substrate 111 between the first and second n-wells 311 and 312, a plurality of insulating materials 112 extending along the first direction may be sequentially provided along the second direction. For example, the plurality of insulating materials 112 and the substrate 111 may be spaced apart along the second direction.

For example, the plurality of insulating materials 112 may be formed to be separated by a desired (and/or alternatively predetermined) distance along the second direction. In example embodiments, the insulating materials 112 may include an insulating material such as silicon oxide, but example embodiments are not limited thereto.

On the substrate 111 between the first and second n-wells 311 and 312, a plurality of pillars 113 may be provided which are sequentially disposed along the first direction and pass through the insulating materials 112 along the second direction. In example embodiments of inventive concepts, the pillars 113 may contact with the substrate 111 through the insulating materials 112, respectively.

In example embodiments, each of the pillars 113 may be formed of a plurality of materials. For example, a surface layer 114 of each pillar 113 may include a first-type silicon material. For example, the surface layer 114 of each pillar 113 may include a silicon material doped with the same type as the substrate 111. Hereinafter, it is assumed that the surface layer 114 of each pillar 113 includes p-type silicon. However, the surface layer 114 of each pillar 113 is not limited thereto.

An inner layer 115 of each pillar 113 may be formed of an insulating material. For example, the inner layer 115 of each pillar 113 may include an insulating material such as silicon oxide. However, example embodiments of inventive concepts are not limited thereto.

Between the first and second n-wells 311 and 312, an insulating film 116 may be provided along exposed surfaces of the substrate 111, the insulating materials 112, and the pillars 113. For example, the thickness of the insulating film 116 may be less than half a distance between the insulating materials 112. That is, a region where a material other than the insulating materials 112 and the insulation layer 116 is disposed may be provided between an insulating film 116 provided on a lower surface of a first insulating material among the insulating materials 112 and an insulating film 116 provided on an upper surface of a second insulating material and at the lower portion of the first insulating material.

Between the first and second n-wells 311 and 312, conductive materials 211 to 291 may be provided on an exposed surface of the insulating film 116. For example, a conductive material 211 extending along the first direction may be provided between the substrate 111 and the insulating material 112 adjacent to the substrate 111. In detail, the conductive material 211 extending along the first direction may be provided between the substrate 111 and the insulating film 116 at a lower surface of the insulating material adjacent to the substrate 111.

A conductive material extending along the first direction may be provided between an insulating film 116 on an upper surface of a specific insulating material of the insulating materials 112 and an insulating film 116 on a lower surface of an insulating material disposed at a top of the specific insulating material. In example embodiments of inventive concepts, a plurality of conductive materials 221 to 281 extending along the first direction may be provided among the insulating materials 112. Further, a conductive material 291 extending along the first direction may be provided on the insulating materials 112. In example embodiments, the conductive materials 211 to 291 may be a metal material or a non-metal material such as polysilicon.

The same structure as that on the first and second n-wells 311 and 312 may be provided between the second and third n-wells 312 and 313. Between the second and third n-wells 312 and 313, there may be provided the insulating materials 112 extending along the first direction, the pillars 113 sequentially disposed in the first direction and passing through the insulating materials 112 along the second direction, the insulating film 116 provided on exposed surfaces of the pillars 113 and the insulating materials 112, and the conductive materials 212 to 292 extending along the first direction. The same structure as that on the first and second n-wells 311 and 312 may be provided between the third and fourth n-wells 313 and 314. Between the third and fourth n-wells 313 and 314, there may be provided the insulating materials 112 extending along the first direction, the pillars 113 sequentially disposed in the first direction and passing through the insulating materials 112 in the third direction, the insulation layer 116 provided on the exposed surfaces of the insulating materials 112 and the pillars 113, and the first conductive materials 213 to 293 extending along the first direction.

Drains 320 may be provided on the pillars 113, respectively. In example embodiments of inventive concepts, the drains 320 may include a second-type silicon material. For example, the drains 320 may be an n-type silicon material. Hereinafter, it is assumed that the drains 320 include an n-type silicon material. However, the drains 320 are not limited thereto. In example embodiments, a width of each drain 320 may be wider than that of a corresponding pillar 113. For example, each drain 320 may be provided on a corresponding pillar 113 to have a pad shape.

Conductive materials 331 to 333 extending along the third direction may be provided on the drains 320. The conductive materials 331 to 333 may be sequentially disposed along the first direction. The conductive materials 331 to 333 may be connected to the drains 320 of corresponding regions, respectively. In example embodiments of inventive concepts, the drains 320 and the second conductive material 333 extending along the third direction may be connected through contact plugs. In example embodiments of inventive concepts, the conductive materials 331 to 333 may be a metal material or a non-metal material such as polysilicon.

Figure 4A:
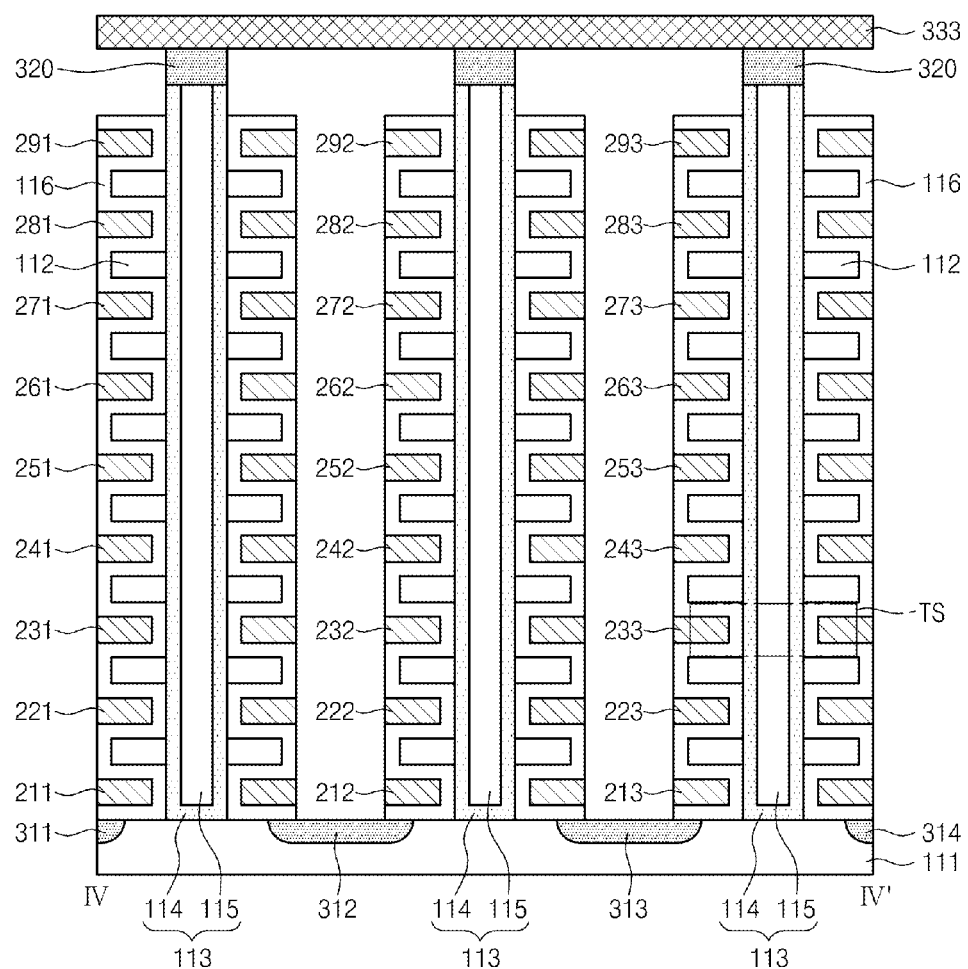
FIG. 4A is a cross-sectional view taken along a line IV-IV' of FIG. 3.

In FIGS. 3 and 4A, each pillar 113 may form a string together with an adjacent region of an insulating film 116 and an adjacent region among the conductive lines 211 to 291, 212 to 292, and 213 to 293 extending along the first direction. For example, each pillar 113 may form a NAND string NS together with an adjacent region of an insulating film 116 and an adjacent region among the conductive lines 211 to 291, 212 to 292, and 213 to 293 extending along the first direction. The NAND string NS may include a plurality of transistor structures TS. The transistor structure TS is described in further detail with reference to FIG. 5.

Figure 4B:
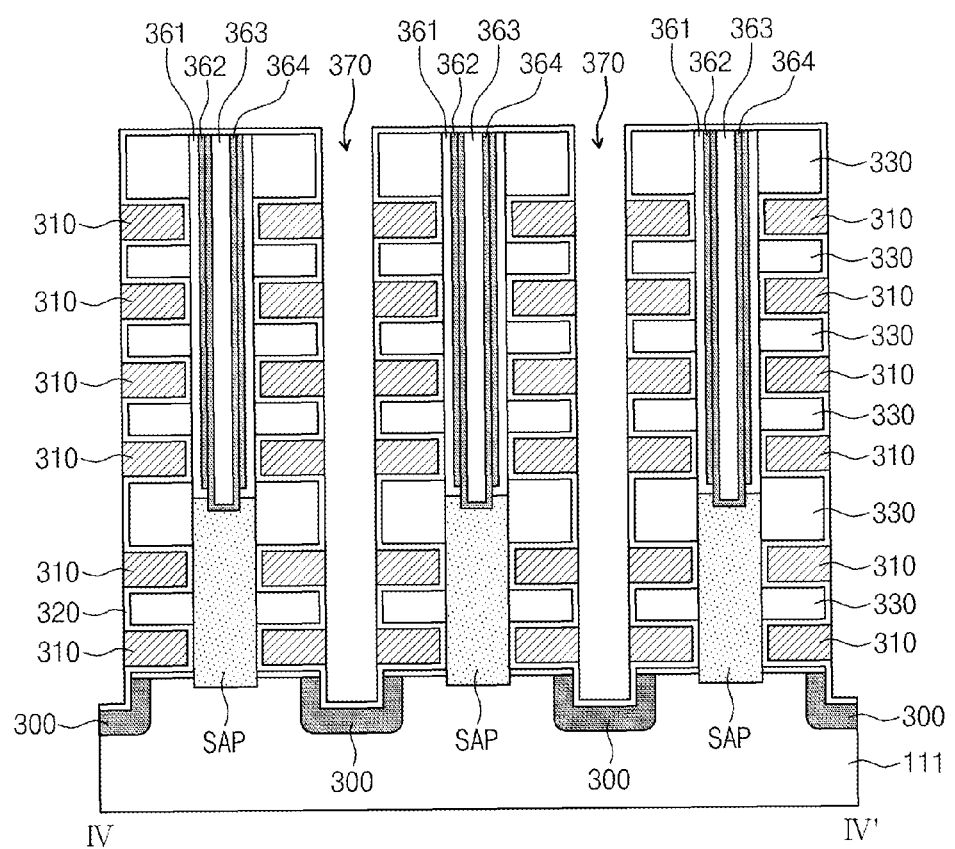
FIG. 4B is a cross-sectional view taken along a line IV-IV' of a memory block according to example embodiments of inventive concepts.
Figure 5:
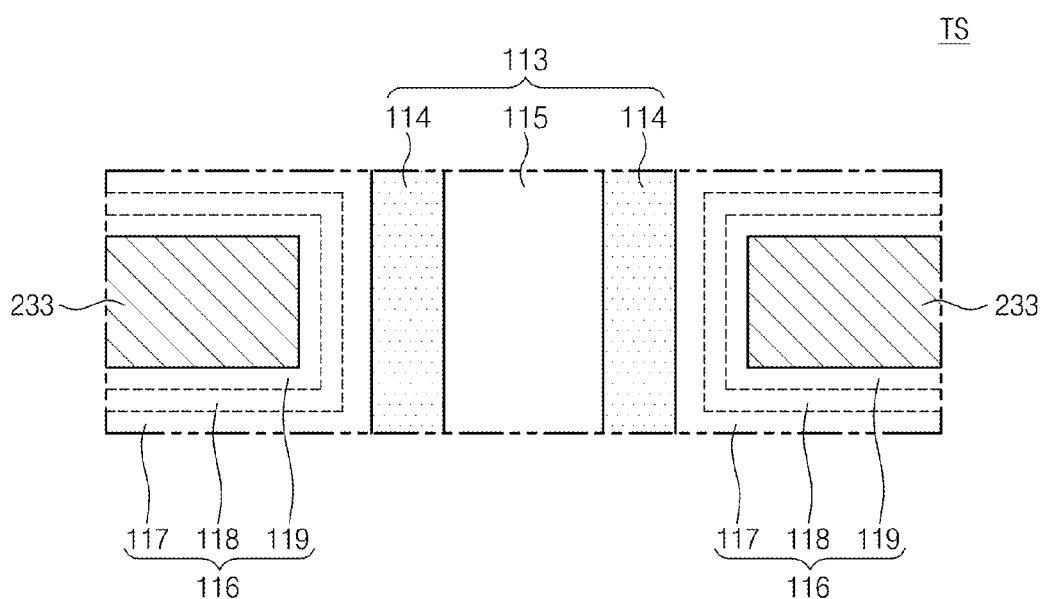
FIG. 5 is a cross-section view of a transistor structure TS in FIG. 5.

FIG. 5 is a cross-sectional view of a transistor structure TS in FIG. 4A. Referring to FIGS. 3 to 4A, an insulating film 116 may include at least three sub-insulating films 117, 118, and 119. The sub-insulating film 119 adjacent to a conductive material 233 extending along a first direction may act as a blocking insulating film. The sub-insulating film 117 adjacent to a pillar 113 may be a silicon oxide film. The sub-insulating film 118 between the sub-insulating films 117 and 119 may be a silicon nitride film. That is, the insulating film 116 may have an ONO (Oxide-Nitride-Oxide) structure.

The conductive material 233 may serve as a gate (or a control gate). The third sub-insulating film 119 adjacent to a first conductive material 233 may act as a blocking insulating film. The second sub-insulating film 118 may act as a charge storage film. For example, the second sub-insulating film 118 may act as a charge trap layer. The first sub-insulating film 117 adjacent to the pillar 113 may act as a tunneling insulating film. A p-type silicon surface layer 114 of a pillar 113 may act as a body. That is, the conductive material 233 serving as a gate (or a control gate), the third sub-insulating film 119 serving as the blocking insulating film, the second sub-insulating film 118 serving as the charge storage layer, the first sub-insulating film 117 serving as the tunneling insulation layer, and the p-type surface layer 114 serving as a body may form a transistor (or, a memory cell transistor structure). Below, it is assumed that the p-type surface layer 114 of the pillar 113 serves as a second-direction body.

A memory block BLKi may include a plurality of pillars 113. That is, the memory block BLKi may include a plurality of NAND strings NS. In detail, the memory block BLKi may include a plurality of NAND strings NS extending along a second direction (or, a direction vertical to a substrate).

Each NAND string NS may include a plurality of transistor structures TS that are disposed along a second direction. At least one of the transistor structures TS of each NAND string NS may serve as a string selection transistor SST. At least one of the transistor structures TS of each NAND string NS may serve as a ground selection transistor GST.

Gates (or control gates) may correspond to conductive materials 211 to 291, 212 to 292, and 213 to 293 extending along a first direction. That is, the gates (or the control gates) may be extended in the first direction to form two selection lines (e.g., at least one string selection line SSL and at least one ground selection line GSL) and word lines extending along the first direction.

Conductive materials 331 to 333 extending in a third direction may be connected to one ends of the NAND strings NS, respectively. Conductive materials 331 to 333 may act as bit lines BL. In the memory block BLK1, one bit line may be connected with a plurality of NAND strings.

The n-wells 311 to 314 extending in the first direction may be provided to other ends of the NAND strings NS, respectively. The n-wells 311 to 314 may serve as common source lines CSL.

To sum up the above description, the memory block BLKi may include a plurality of NAND strings that extend in a direction (i.e., the second direction) vertical to the substrate 111, and may be a NAND flash memory block (e.g., a charge trap type) in which a plurality of NAND strings NS may be connected to one bit line BL.

FIGS. 3 and 4A were described under the assumption that conductive lines 211 to 291, 212 to 292, and 213 to 293 extending along the first direction are formed at nine layers. However, example embodiments of inventive concepts are not limited thereto. For example, conductive lines extending along the first direction may be provided at 8, 16, or plural layers. That is, one NAND string may include 8, 16, or plural transistors.

FIGS. 3 and 4A were described under the assumption that three NAND strings NS are connected to a bit line. However, example embodiments of inventive concepts are not limited thereto. According to example embodiments of inventive concepts, in a memory block BLKi, m NAND strings NS may be connected to a bit line BL. At this time, the number of conductive materials 211 to 291, 212 to 292, and 213 to 293 extending along the first direction and the number of common source lines 311 through 314 may be adjusted according to the number of NAND strings NS connected to a bit line BL.

FIGS. 3 and 4A were described under the assumption that three NAND strings NS are connected to a conductive material extending along the first direction. However, example embodiments of inventive concepts are not limited thereto. For example, NAND strings NS may be connected to a conductive material extending along the first direction. At this time, the number of bit lines 331 to 333 may be adjusted according to the number of NAND strings connected to a bit line extending along the first direction.

FIG. 4B is a cross-sectional view taken along a line IV-VI' of a memory block according to example embodiments of inventive concepts.

Referring to FIGS. 3 and 4B, a memory block BLKi may include structures extending along first to third directions. Referring to FIG. 4B, a selection active pattern SAP and vertical structures 361, 362, 363, and 364 may be formed to fill holes or openings. As a result, the selection active pattern SAP may be formed to have a rectangular shape as illustrated in FIG. 4B. In a case where side wells of the holes or openings are not vertical to an upper surface of a substrate 111, the selection active pattern SAP may have a trapezoidal shape.

The selection active pattern SAP may contact with an upper surface of the substrate 111. In detail, insulating films and sacrifice films may be stacked on the substrate 111 in turn and iteratively, and holes or openings may be formed to penetrate the insulating films and sacrifice films. Afterwards, the selection active pattern SAP and the vertical structures 361, 362, 363, and 364 may be sequentially formed within the holes or openings. Trenches 370 may be formed to expose the substrate 111 by sequentially patterning the stacked insulating films and sacrifice films. At this time, a mold pattern may be formed between adjacent trenches 370. The mold pattern may include insulating patterns 330 and sacrifice patterns that are stacked in turn and iteratively. The sacrifice patterns exposed by the trenches 370 may be replaced with conductive pattern 310. A common source region 300 may be formed within the substrate 111 under the trenches 370. A memory block illustrated in FIG. 4B may be formed by the above processes.

The above-described nonvolatile memory device may include a string selection transistor SST controlling connection between a cell string and a bit line and a ground selection transistor GST controlling connected between a cell string and a common source line. The string selection transistor SST may be connected to a string selection line SSL, and the ground selection transistor GST may be connected to a ground selection line GSL. The nonvolatile memory device may control programming, reading, or erasing by providing the string and ground selection lines SSL and GSL with voltages suitable for each mode of operation.

According to example embodiments of inventive concepts, the same voltage may be provided to the string and ground selection lines SSL and GSL by setting threshold voltages of the string and ground selection transistors SST and GST differently. The selection lines SSL and GSL may be controlled by one line by providing the same voltage to the selection lines SSL and GSL at each mode of operation of the nonvolatile memory device.

Below, there will be described various manners in which the selection lines SSL and GSL are connected via one line when threshold voltages of the string and ground selection transistors SST and GST are set to be different from each other.

Figure 6:
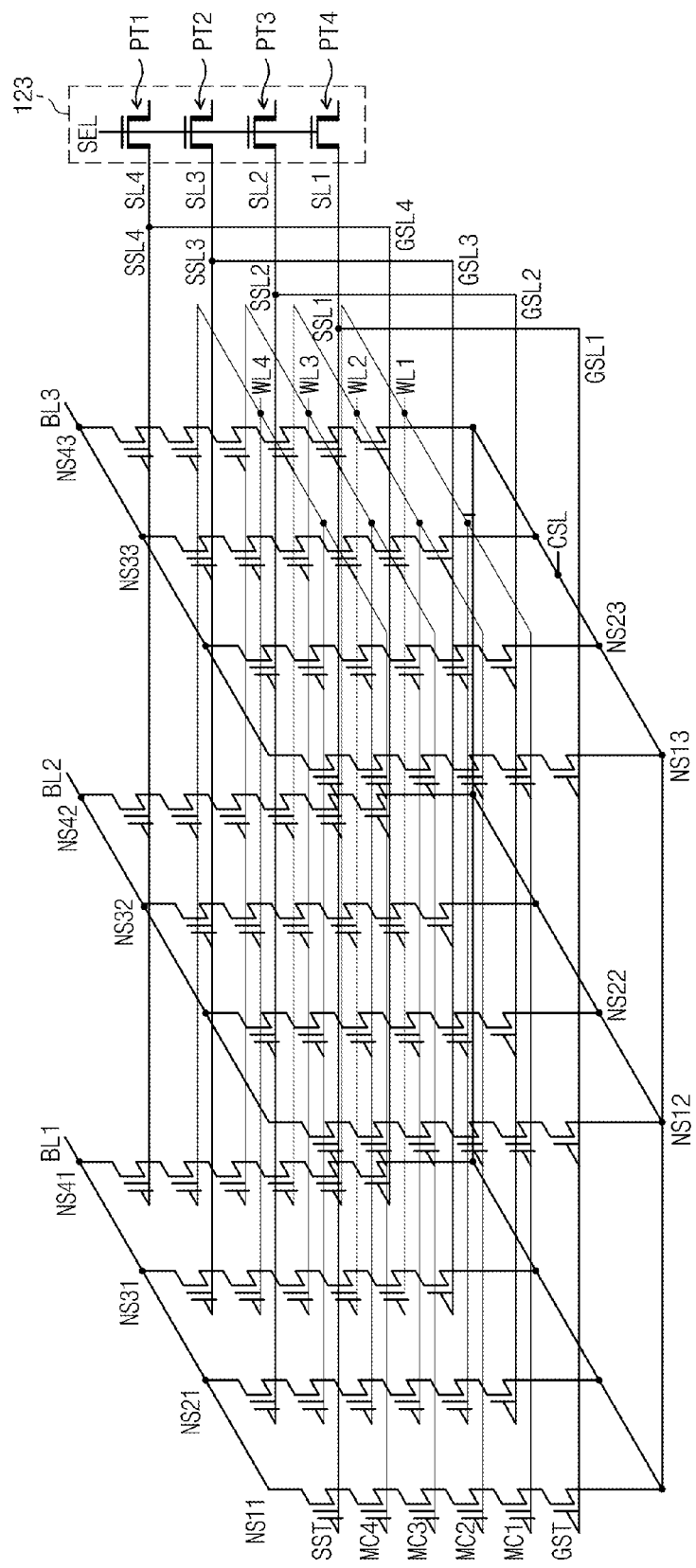
FIG. 6 is an equivalent circuit diagram of a memory cell array and a selection line driver according to example embodiments of inventive concepts.

FIG. 6 is an equivalent circuit diagram of a memory cell array and a selection line driver according to example embodiments of inventive concepts.

Referring to FIG. 6, NAND strings NS11, NS21, NS31, and NS41 may be provided between a first bit line BL1 and a common source line CSL. NAND strings NS12, NS22, NS32, and NS42 may be provided between a second bit line BL2 and the common source line CSL. NAND strings NS13, NS23, NS33, and NS43 may be provided between a third bit line BL3 and the common source line CSL. The first bit line BL3 may correspond to a conductive material (e.g., 333) extending in the third direction.

Each NAND string NS may include a string selection transistor SST, which is connected to a corresponding bit line BL. In each NAND string NS, memory cells MC may be provided between the string selection transistor SST and the ground selection transistor GST. The string selection transistor SST may be made to have the same structure as memory cells. The ground selection transistor GST may be made to have a transistor structure different from the memory cells. The string selection transistor SST may have a transistor structure including a charge storage layer, and the ground selection transistor GST may have a transistor structure not including a charge storage layer.

Below, NAND strings NS may be defined by the row and by the column. The NAND strings NS connected to one bit line in common may form one column. For example, the NAND strings NS11 to NS41 connected to the first bit line BL1 may correspond to a first column. The NAND strings NS12 to NS42 connected to the second bit line BL2 may correspond to a second column. The NAND strings NS13 to NS43 connected to the third bit line BL3 may correspond to a third column. The NAND strings NS connected to one string selection line SSL may form one row. For example, the NAND strings NS11 to NS13 connected to a first string selection line SSL1 may form a first row. The NAND strings NS21 to NS23 connected to a second string selection line SSL2 may form a second row. The NAND strings NS31 to NS33 connected to a third string selection line SSL3 may form a third row. The NAND strings NS41 to NS43 connected to a third string selection line SSL3 may form a fourth row.

In each NAND string NS, a height may be defined. In example embodiments, in each NAND string NS, a memory cell MC1 adjacent to the ground selection transistor GST may be defined to have a height of 1. In each NAND string NS, a height of a memory cell may increase in inverse proportion to a distance from a string selection transistor SST. In each NAND string NS, a memory cell MC4 adjacent to the string selection transistor SST may be defined to have a height of 4.

The selection line driver 123 may include a plurality of path transistors PT1, PT2, PT3, and PT4. The selection line driver 123 may be connected to the string selection line SSL and the ground selection line GSL.

According to example embodiments of inventive concepts, the ground selection line GSL may be a line connecting local ground selection lines in the same row. A ground selection line and a string selection line in the same row may be connected to the same path transistor. Referring to FIG. 6, selection lines SL1, SL2, SL3, and SL4 connecting ground selection lines and string selection lines corresponding to the ground selection lines may be connected to different path transistors PT1, PT2, PT3, and PT4.

Referring to FIG. 6, a ground selection transistor GST may be a transistor that has a structure different from a string selection transistor SST and a memory cell MC. A threshold voltage of the ground selection transistor GST may be different from that of the string selection transistor SST. The threshold voltage of the ground selection transistor GST may be decided to be supplied with the same voltage as the string selection transistor SST at each mode of operation. That is, the ground selection transistor GST and the string selection transistor SST may be managed as a transistor by setting threshold voltages of the ground and string selection transistors GST and SST differently.

In FIG. 6, a first NAND string may include a first string selection transistor, a first ground selection transistor having a threshold voltage different from the first string selection transistor, and first memory cells stacked in a direction vertical to a substrate. A second NAND string may be placed at a row different from the first NAND string, and may include a second string selection transistor, a second ground selection transistor having a threshold voltage different from the second string selection transistor, and second memory cells stacked in a direction vertical to the substrate.

According to example embodiments of inventive concepts, the first and second ground selection transistors may be electrically isolated, and may be connected to different path transistors of the selection line driver 123. The first and second string selection transistors may be electrically isolated, and may be connected to different path transistors of the selection line driver 123.

A threshold voltage of the first ground selection transistor may be higher than that of the first string selection transistor. A threshold voltage of the second ground selection transistor may be higher than that of the second string selection transistor. For example, a threshold voltage of the first ground selection transistor may be higher than a power supply voltage and lower than a read voltage provided to an unselected word line. A threshold voltage of the second ground selection transistor may be higher than a power supply voltage and lower than a read voltage provided to an unselected word line. Threshold voltages of ground and string selection transistors may be decided at a fabrication process.

Referring to FIG. 6, a memory cell array may include a first selection line SL1 connecting the first string selection transistor and the first ground selection transistor and a second selection line SL2 connecting the second string selection transistor and the second ground selection transistor, and the first and second selection lines SL1 and SL2 may be electrically isolated from each other.

The nonvolatile memory device may include the selection line driver 123 that is configured to selectively provide a bias voltage to the first and second selection lines SL1 and SL2. The selection line driver 123 may include a plurality of path transistors PT1 to PT4. The first selection line SL1 may be connected to the fourth path transistor PT4, and the second selection line SL2 may be connected to the third path transistor PT3.

Referring to FIG. 6, memory cells at the same height may be connected to word lines WL in common. Thus, when a specific word line WL is selected, all NAND strings NS connected to the specific word line may be selected. NAND strings in different rows may be connected to different string selection lines SSL.

Bit lines BL1 to BL3 may be separated from NAND strings in an unselected row from among NAND strings NS connected to the same word line by selecting string selection lines SSL1 to SSL4. That is, a row of NAND strings NS may be selected by selecting the string selection lines SSL1 to SSL4. NAND strings in the selected row may be selected by a column unit by selecting the bit lines BL1 to BL3.

At a program operation, a string selection transistor in a selected NAND string may be turned on, and a ground selection transistor thereof may be turned off. Further, a string selection transistor in an unselected NAND string may be turned off, and a ground selection transistor thereof may be turned off.

The ground selection transistor GST and the string selection transistor SST may be managed like a transistor by setting threshold voltages of the ground and string selection transistors differently.

Figure 7:
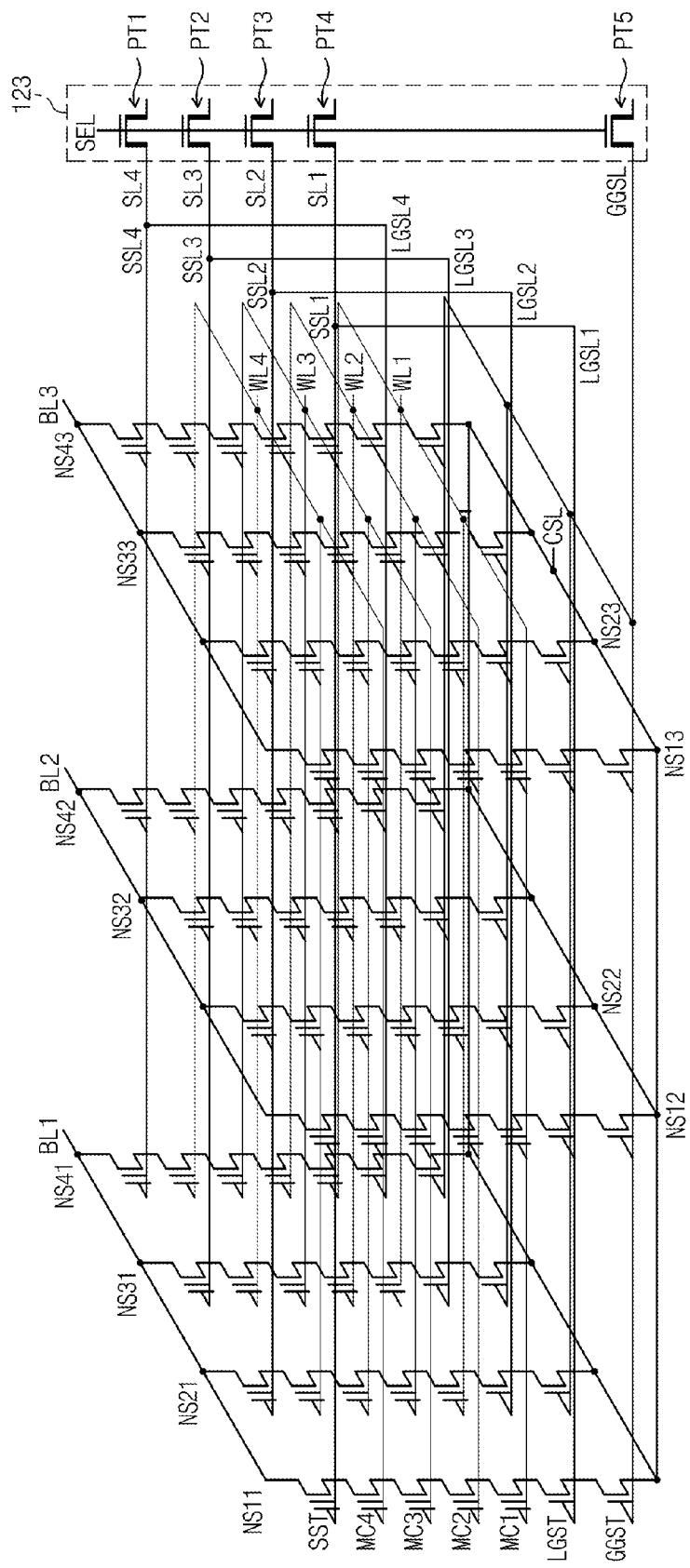
FIG. 7 is an equivalent circuit diagram of a memory cell array and a selection line driver according to example embodiments of inventive concepts.

FIG. 7 is an equivalent circuit diagram of a memory cell array and a selection line driver according to example embodiments of inventive concepts.

Referring to FIG. 7, each NAND string NS may include a string selection transistor SST, which is connected to a corresponding bit line BL. In each NAND string NS, memory cells may be arranged between a string selection transistor SST and a local ground selection transistor LGST.

The string selection transistor SST may be made to have the same structure as a memory cell having a charge storage layer. Local and global ground selection transistors LGST and GGST may be made to have a transistor structure different from a memory cell.

The selection line driver 123 may include a plurality of path transistors PT1, PT2, PT3, PT4, and PT5. The selection line driver 123 may be connected to the string selection line SSL, the local ground selection line LGSL, and the global ground selection line GGSL.

According to example embodiments of inventive concepts, the local ground selection line LGSL may be a line connecting local ground selection transistors in the same row. A ground selection line and a string selection line in the same row may be connected to the same path transistor. Referring to FIG. 7, selection lines SL1, SL2, SL3, and SL4 connecting local ground selection lines and string selection lines corresponding to the local ground selection lines may be connected to different path transistors PT1, PT2, PT3, and PT4.

The global ground selection line GGSL may connect global ground transistors GGST of NAND strings NS, and may be connected to NAND strings NS in common. For example, a first NAND string may include a first global ground selection transistor, and a second NAND string may include a second global ground selection transistor. The global ground selection line GGSL may connect the first and second global ground selection transistors. The global ground selection line GGSL may be connected to a specific path transistor PT5 of the selection line driver 123.

A threshold voltage of the local ground selection transistor may be higher than that of the string selection transistor. For example, a threshold voltage of the local ground selection transistor may be higher than a power supply voltage and lower than a read voltage provided to an unselected word line. Threshold voltages of the local ground selection transistor and the string selection transistor may be decided at a fabrication process.

The nonvolatile memory device 100 may include the selection line driver 123 that is configured to selectively provide a bias voltage to first and second selection lines SL1 and SL2. The selection line driver 123 may include a plurality of path transistors PT1 to PT5. The first selection line SL1 may be connected to the first path transistor PT1, and the second selection line SL2 may be connected to the second path transistor PT2.

The nonvolatile memory device 100 may include the global ground selection transistor GGST and the local ground selection transistor LGST. The global ground selection transistor GGST and the local ground selection transistor LGST may have a structure different from the string selection transistor SST or a memory cell.

The global ground selection transistor GGST may be connected to a fifth path transistor PT5 via the global ground selection line GGSL. The local ground selection transistor LGST may be connected to a corresponding local ground selection line LGSL. That is, a first local ground selection line LGSL1 may be connected to a first string selection line SSL1 and to a fourth path transistor PT4 via the first selection line SL1. Likewise, a fourth local ground selection line LGSL4 may be connected to a fourth string selection line SSL4 and to a first path transistor PT1 via a fourth selection line SL4.

As described with reference to FIG. 6, the local ground selection transistor LGST and the string selection transistor SST may be managed like a transistor by setting threshold voltages of the local ground selection transistor and the string selection transistor differently.

Figure 8:
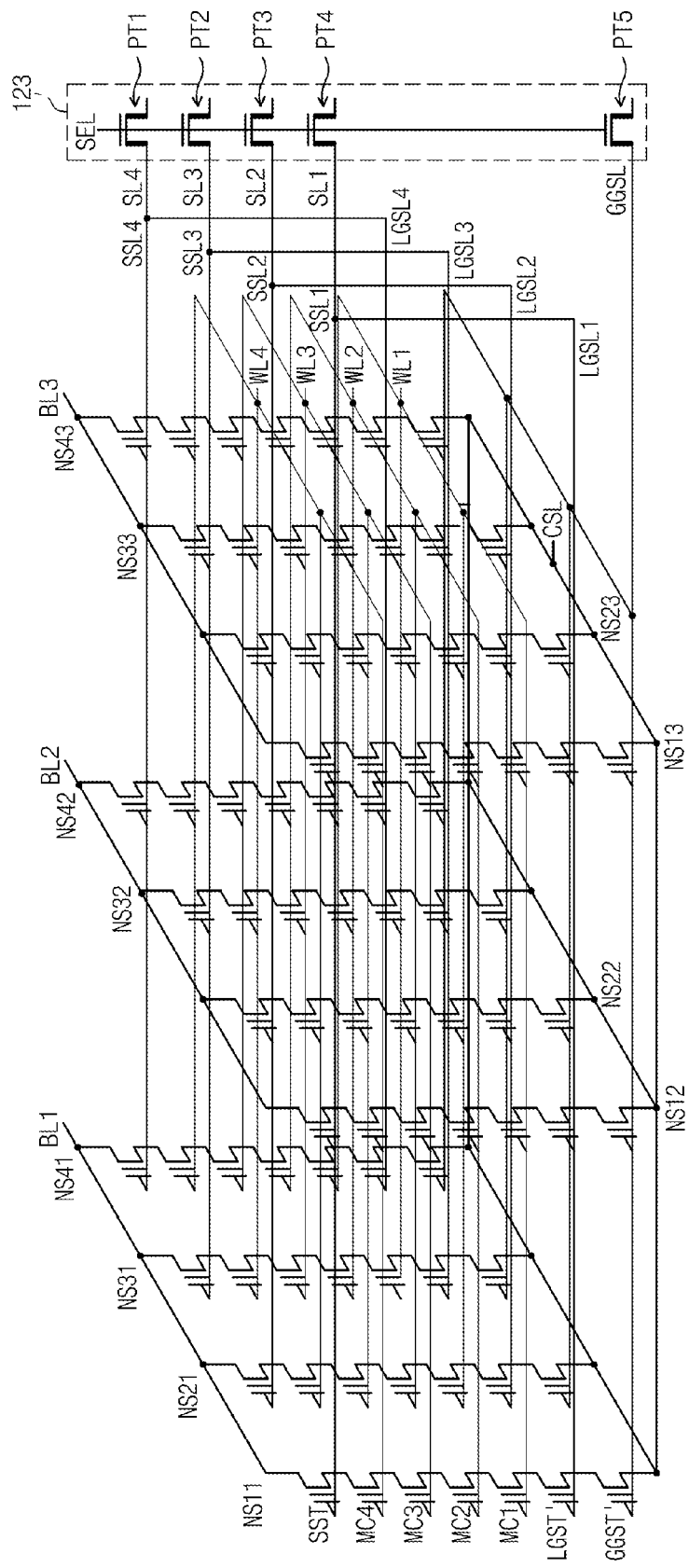
FIG. 8 is an equivalent circuit diagram of a memory cell array and a selection line driver according to example embodiments of inventive concepts.

FIG. 8 is an equivalent circuit diagram of a memory cell array and a selection line driver according to example embodiments of inventive concepts. In FIG. 8, there is illustrated the case that local and global ground selection transistors LGST' and GGST' have the same structure as a string selection transistor SST or a memory cell MC.

Referring to FIG. 8, a nonvolatile memory device 100 may include a selection line driver 123 that is configured to selectively provide a bias voltage to selection lines SL1 to SL4 and GGSL. The selection line driver 123 may include a plurality of path transistors PT1 to PT5. The first selection line SL1 may be connected to the first path transistor PT1, the second selection line SL2 may be connected to the second path transistor PT2, and the global ground selection line GGSL may be connected to the fifth path transistor PT5.

A threshold voltage of the local ground selection transistor LGST' may be higher than that of the string selection transistor SST. For example, a threshold voltage of the local ground selection transistor LGST' may be higher than a power supply voltage and lower than a read voltage provided to an unselected word line. Threshold voltages of the local ground selection transistor LGST' and the string selection transistor SST may be decided at a fabrication process.

The nonvolatile memory device 100 may include the global ground selection transistor GGST' and the local ground selection transistor LGST'. The global ground selection transistor GGST' or the local ground selection transistor LGST' may have a structure equal to that of the string selection transistor SST or a memory cell.

The local ground selection transistor LGST' and the string selection transistor SST may be managed using one line by setting threshold voltages of the local ground selection transistor and the string selection transistor differently.

Figure 9:
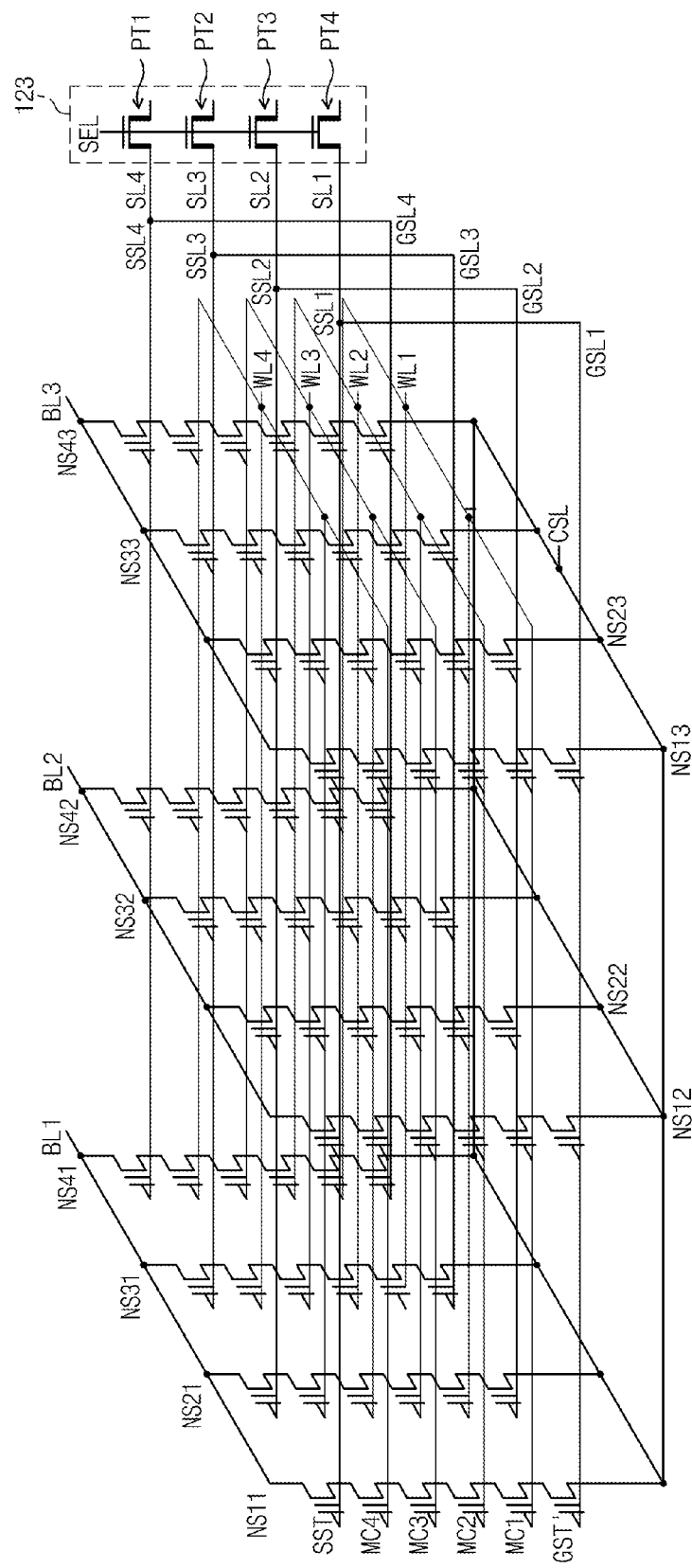
FIG. 9 is an equivalent circuit diagram of a memory cell array and a selection line driver according to example embodiments of inventive concepts.

FIG. 9 is an equivalent circuit diagram of a memory cell array and a selection line driver according to example embodiments of inventive concepts. In FIG. 9, there is illustrated the case that a ground selection transistor GST has the same structure as a string selection transistor SST or a memory cell MC.

Referring to FIG. 9, the nonvolatile memory device 100 may include a selection line driver 123 that is configured to selectively provide a bias voltage to selection lines SL1 to SL4 and GGSL. The selection line driver 123 may include a plurality of path transistors PT1 to PT4. The first to fourth selection lines SL1 to SL4 may be connected to the first to fourth path transistors PT1 to PT4, respectively.

A threshold voltage of the ground selection transistor GST may be different in level from that of the string selection transistor SST. For example, a threshold voltage of the ground selection transistor GST may be higher than that of the string selection transistor SST. For example, a threshold voltage of the ground selection transistor LGST may be higher than a power supply voltage and lower than a read voltage provided to an unselected word line. Threshold voltages of the ground and string selection transistors may be decided at a fabrication process.

The ground selection transistor GST and the string selection transistor SST may be managed using one line by setting threshold voltages of the ground and string selection transistors differently.

Figure 10:
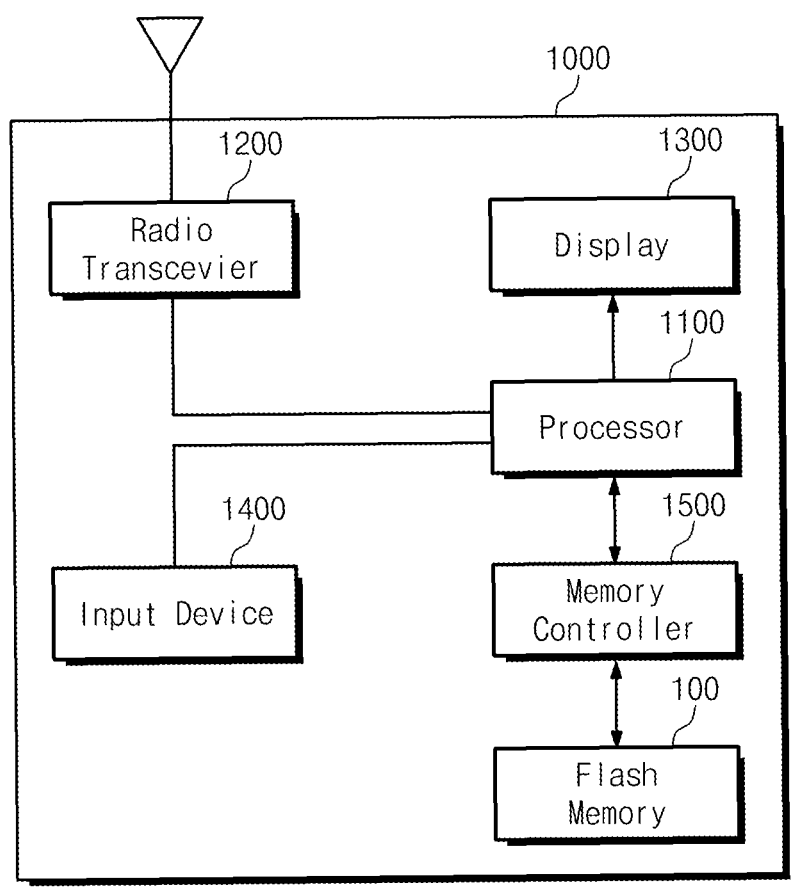
FIG. 10 is a block diagram schematically illustrating an electronic device including a nonvolatile memory device according to example embodiments of inventive concepts.

FIG. 10 is a block diagram schematically illustrating an electronic device including a nonvolatile memory device according to example embodiments of inventive concepts.

Referring to FIG. 10, an electronic device 1000 such as a cellular phone, a smart phone, or a tablet PC may include a nonvolatile memory device 100 formed of a flash memory device and a memory controller 150 controlling an operation of the nonvolatile memory device 100.

The nonvolatile memory device 100 may correspond to a three-dimensional nonvolatile memory device described in relation to FIGS. 1 to 9.

The memory controller 150 may be controlled by a processor 1100 controlling an overall operation of the electronic device 1000.

Data stored in the nonvolatile memory device 100 may be displayed via a display 1300 under the control of the memory controller 1500 that operates in response to the control of a processor 1100.

A radio transceiver 1200 may transmit and receive a radio signal via an antenna. For example, the radio transceiver 1200 may convert a radio signal received via the antenna to a signal suitable for the processor 1100 to process. The processor 1100 may process a signal output from the radio transceiver 1200, and the processed signal may be stored in the nonvolatile memory device 1600 via the memory controller 1500 or displayed via the display 1300.

The radio transceiver 1200 may convert a signal from the processor 1100 to a radio signal to output it to an external device via the antenna.

An input device 1400 may be a device capable of receiving a control signal for controlling an operation of the processor 1100 or data to be processed by the processor 1100. The input device 1400 may include a pointing device such as a touch pad or a computer mouse, a keypad, or a keyboard.

The processor 1100 may control the display 1300 so as to display data output from the nonvolatile memory device 1600, a radio signal from the radio transceiver 1200, or data from the input device 1400.

Figure 11:
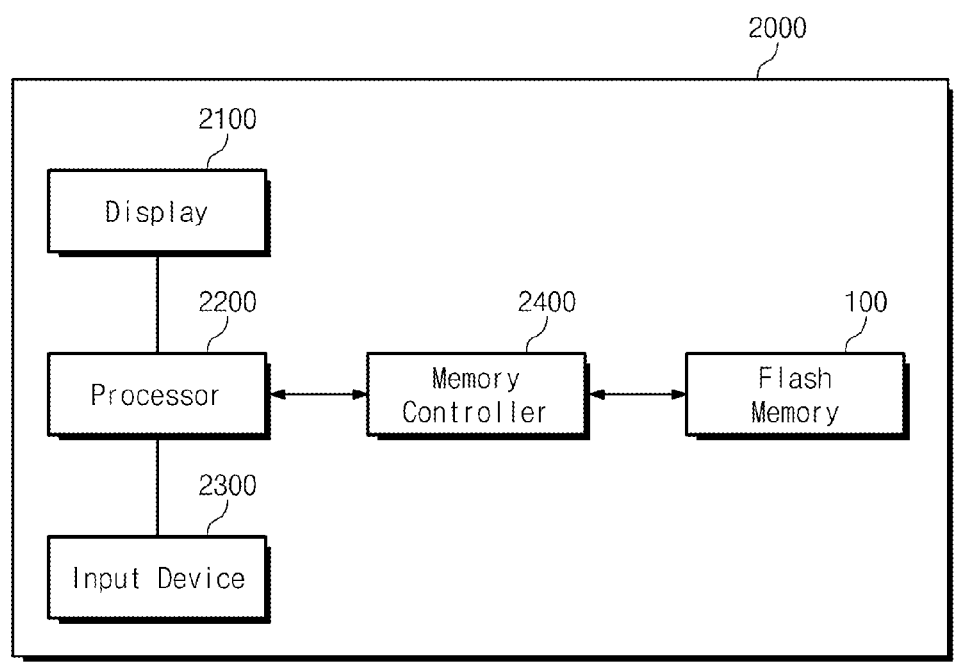
FIG. 11 is a block diagram schematically illustrating an electronic device including a nonvolatile memory device according to example embodiments of inventive concepts.

FIG. 11 is a block diagram schematically illustrating an electronic device including a nonvolatile memory device according to example embodiments of inventive concepts.

Referring to FIG. 11, an electronic device 2000 may be a data processing device such as a personal computer, a tablet computer, a net-book, an e-reader, a PDA, a PMP, an MP3 player, or an MP4 player, and may include a nonvolatile memory device 100 such as a flash memory device and a memory controller 2400 controlling an operation of the nonvolatile memory device 100.

The nonvolatile memory device 100 may correspond to a three-dimensional nonvolatile memory device described in relation to FIGS. 1 to 9.

The electronic device 2000 may include a processor 2200 controlling an overall operation of the electronic device 2000. The memory controller 2400 may be controlled by the processor 2200.

The processor 2200 may display data, stored in a nonvolatile memory device, via a display 2100 according to an input signal generated by an input device 2300. For example, the input device 2300 may be formed of a pointing device such as a touch pad or a computer mouse, a keypad, or a keyboard.

Figure 12:
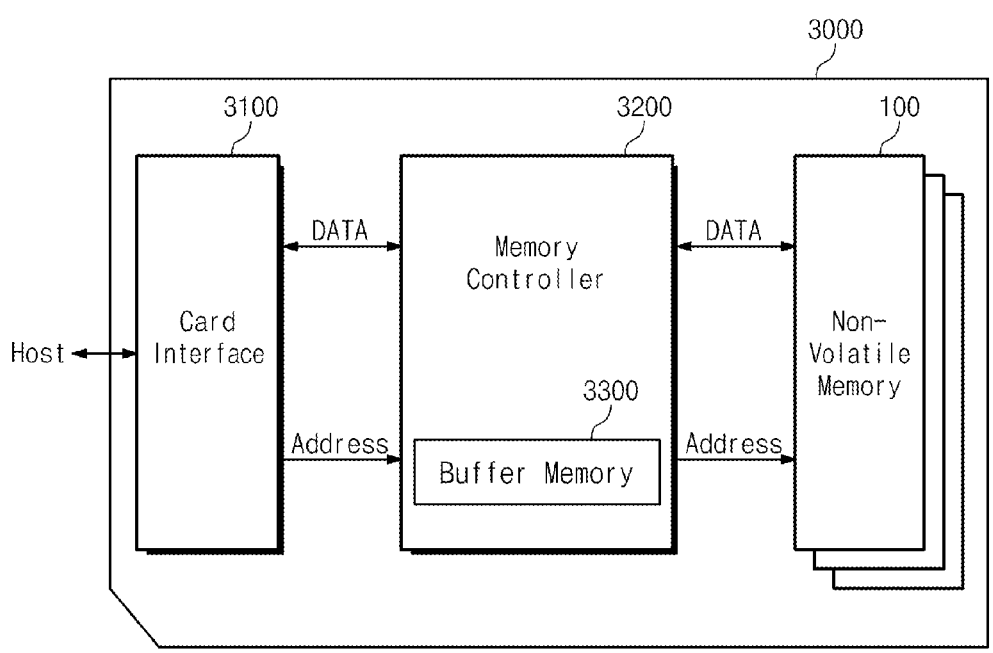
FIG. 12 is a block diagram schematically illustrating an electronic device including a nonvolatile memory device according to example embodiments of inventive concepts.

FIG. 12 is a block diagram schematically illustrating an electronic device including a nonvolatile memory device according to example embodiments of inventive concepts.

Referring to FIG. 12, an electronic device 3000 may include a card interface 3100, a memory controller 3200, and a nonvolatile memory device 100, for example, a flash memory device.

The electronic device 3000 may exchange data with a host via card interface 3100. In example embodiments, the card interface 3100 may be an SD card interface or an MMC interface. However, example embodiments of inventive concepts are not limited thereto. The card interface 3100 may exchange data between the host and the memory controller 3200 according to the communication protocol of the host capable of communicating with the electronic device 3000.

The memory controller 3200 may control an overall operation of the electronic device 3000, and may control data exchange between the card interface 3100 and the nonvolatile memory device 100. A buffer memory 3300 of the memory controller 3200 may buffer data transferred between the card interface 3100 and the nonvolatile memory device 100.

The memory controller 3200 may be connected to the card interface 3100 and the nonvolatile memory device 100 via a data bus and an address bus. In example embodiments, the memory controller 3200 may receive an address of data to be read or written via the address bus from the card interface 3100 to send it to the nonvolatile memory device 100.

The memory controller 3200 may receive or send data to be read or to be written via the data bus connected to the card interface 3100 or the nonvolatile memory device 100.

The nonvolatile memory device 100 may correspond to a three-dimensional nonvolatile memory device described in relation to FIGS. 1 to 9.

The nonvolatile memory device 100 may store various data. In example embodiments, a read operation and a write operation may be simultaneously performed at the nonvolatile memory device 100. At this time, a memory cell array of the nonvolatile memory device 100, in which a read operation is executed, may be different from a memory cell array of the nonvolatile memory device 100 in which a write operation is executed.

When the electronic device 3000 in FIG. 12 is connected to a host such as a PC, a tablet PC, a digital camera, a digital audio player, a cellular phone, a console video game hardware, or a digital set-top box, the host may send or receive data stored in the nonvolatile memory device 100 via the card interface 3100 and the memory controller 3200.

Figure 13:
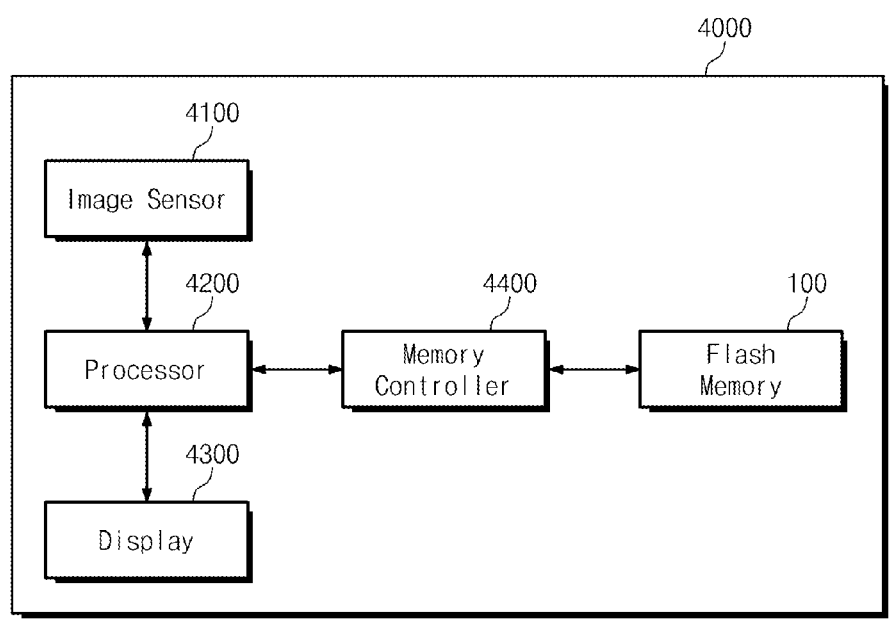
FIG. 13 is a block diagram schematically illustrating an electronic device including a nonvolatile memory device according to example embodiments of inventive concepts.

FIG. 13 is a block diagram schematically illustrating an electronic device including a nonvolatile memory device according to example embodiments of inventive concepts.

Referring to FIG. 13, an electronic device 4000 may include a nonvolatile memory device 100 such as a flash memory device, a memory controller 4400 controlling a data processing operation of the nonvolatile memory device 100, and a processor 4100 controlling an overall operation of the electronic device 4000. The nonvolatile memory device 100 may correspond to a three-dimensional nonvolatile memory device described in relation to FIGS. 1 to 9.

An image sensor 4200 of the electronic device 4000 may convert an optical signal to a digital signal, and the digital signal may be stored in the nonvolatile memory device 100 or displayed via a display 4300 under the control of the processor 4200.

Figure 14:
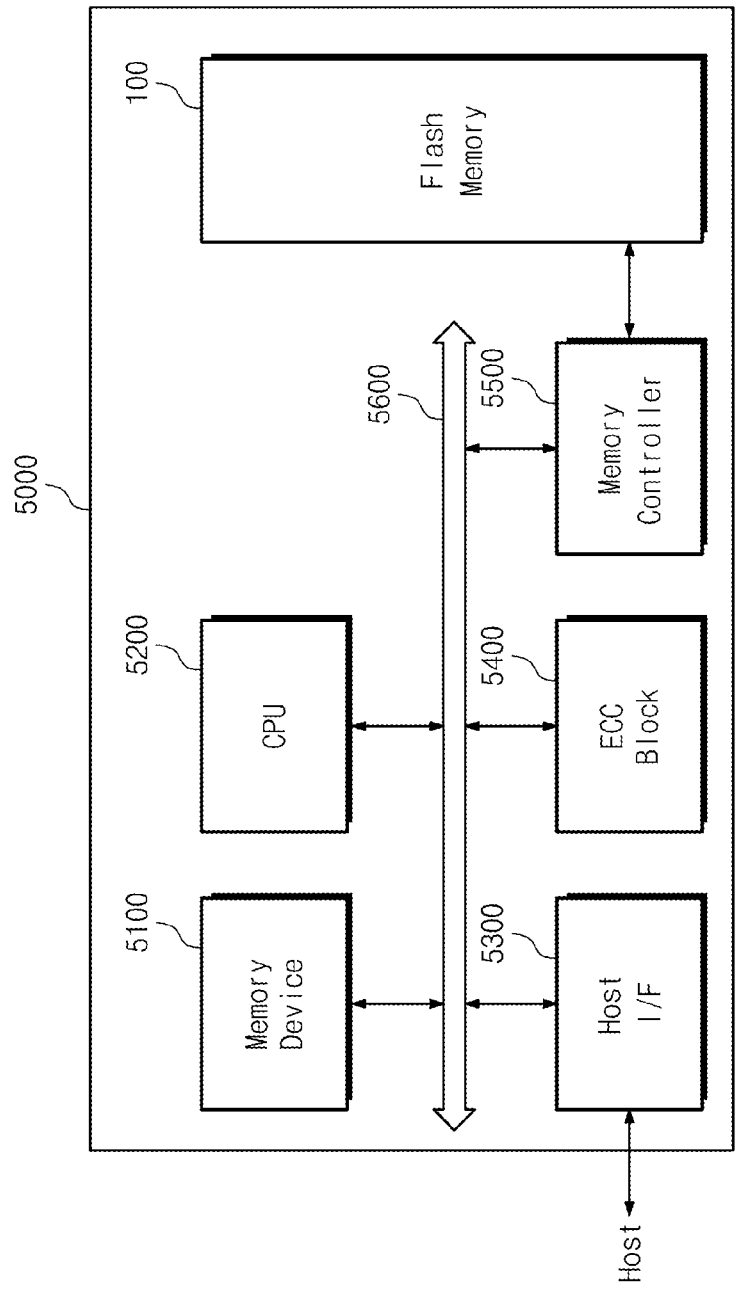
FIG. 14 is a block diagram schematically illustrating an electronic device including a nonvolatile memory device according to example embodiments of inventive concepts.

FIG. 14 is a block diagram schematically illustrating an electronic device including a nonvolatile memory device according to example embodiments of inventive concepts.

Referring to FIG. 14, an electronic device 5000 may include a nonvolatile memory device 100 such as a flash memory device, a memory controller 5500 controlling an operation of the nonvolatile memory device 100, and a CPU 5200 controlling an overall operation of the electronic device 5000.

The nonvolatile memory devices 100, 100-1, and 100-2 may be a three-dimensional nonvolatile memory device 100 described in relation to FIGS. 1 to 9.

The electronic device 5000 may include a memory 5100 that is used as a working memory of the CPU 5200. The memory 5100 may be formed of a nonvolatile memory device such as ROM or a volatile memory such as DRAM.

A host connected with the electronic device 5000 may exchange data with the nonvolatile memory device 100 via a memory controller 5500 and a host interface 5300. At this time, the memory controller 5500 may perform a memory interface, for example, a flash memory interface function.

The electronic device 5000 may further include an ECC block 5400. The ECC block 5400 may operate responsive to the control of the CPU 5200, and may detect and correct an error of data read from the nonvolatile memory device 100 via the memory controller 5500.

The CPU 5200 may control data exchange among the memory controller 5500, the ECC block 5400, the host interface 5300, and the memory 5100 via a bus 5600.

The electronic device 5000 may be formed of a USB memory drive or a memory stick.

Figure 15:
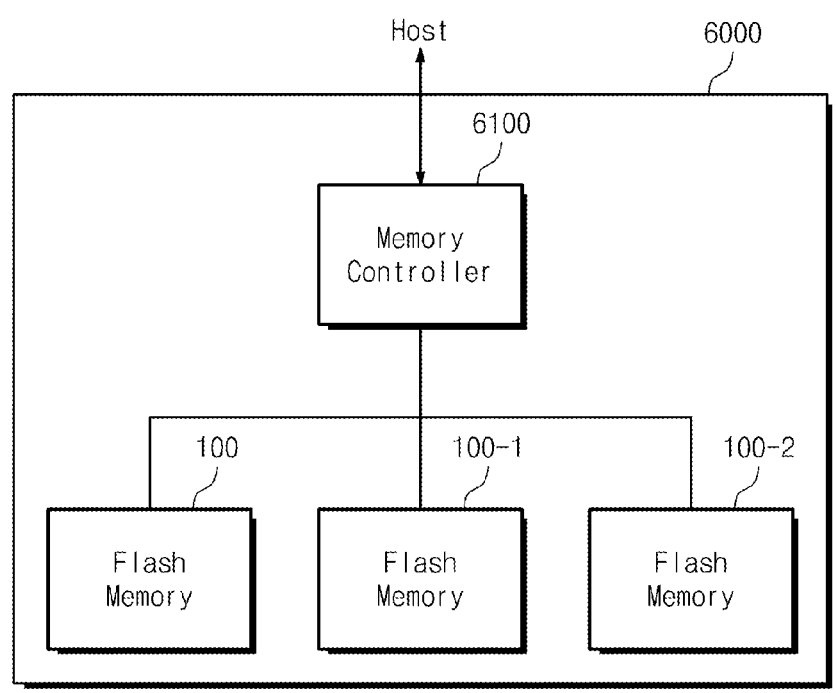
FIG. 15 is a block diagram schematically illustrating an electronic device including a nonvolatile memory device according to example embodiments of inventive concepts.

FIG. 15 is a block diagram schematically illustrating an electronic device including a nonvolatile memory device according to example embodiments of inventive concepts.

Referring to FIG. 15, an electronic device 6000 may be implemented by a data storage device such as a Solid State Drive (SSD).

The electronic device 6000 may include a plurality of nonvolatile memory devices 100, 100-1, and 100-2 and a memory controller 6100 controlling a data processing operation of each of the plurality of nonvolatile memory devices 100, 100-1, and 100-2. The electronic device 6000 may be implemented by a memory system or a memory module.

The nonvolatile memory devices 100, 100-1, and 100-2 may be a three-dimensional nonvolatile memory device 100 described in relation to FIGS. 1 to 9.

The electronic device 6000 may be implemented by a memory system or a memory module. The controller 6100 can be implemented outside or inside of the electronic device 6000.

While some example embodiments have been particularly shown and described, it will be understood by one of ordinary skill in the art that variations in form and detail may be made therein without departing from the spirit and scope of the claims.

What is claimed is:

1. A nonvolatile memory device comprising:
   a first NAND string including a first string selection transistor, a first ground selection transistor having a threshold voltage that is higher than a threshold voltage of the first string selection transistor, and first memory cells stacked on a substrate;
   a second NAND string including a second string selection transistor, a second ground selection transistor having a threshold voltage that is higher than a threshold voltage of the second string selection transistor, and second memory cells stacked on the substrate;
   a first selection line,
      the first selection line being connected to the first string selection transistor by a first string selection line, and
      the first selection line being connected to the first ground selection transistor by a first ground selection line; and
   a second selection line that is electrically isolated from the first selection line, the second selection line being connected to the second string selection transistor by a second string selection line, and
the second selection line being connected to the second ground selection transistor by a second ground selection line.

2. The nonvolatile memory device of claim 1, further comprising:
a plurality of word lines connected to the first memory cells and the second memory cells; and
a driver circuit configured to provide a power supply voltage and a read voltage to at least one of the first memory cells and at least one of the second memory cells through an unselected word line of the plurality of word lines, wherein
the threshold voltage of the first ground selection transistor is higher than the power supply voltage and lower than the read voltage provided to the unselected word line.

3. The nonvolatile memory device of claim 1, further comprising:
a plurality of word lines connected to the first memory cells and the second memory cells; and
a driver circuit configured to provide a power supply voltage and a read voltage to at least one of the first memory cells and at least one of the second memory cells through an unselected word line of the plurality of word lines, wherein
the threshold voltage of the second ground selection transistor is higher than the power supply voltage and lower than the read voltage provided to the unselected word line.

4. The nonvolatile memory device of claim 1, further comprising:
a global ground selection line, wherein
the first NAND string further includes a first global ground selection transistor,
the second NAND string further includes a second global ground selection transistor, and
the global ground selection line connects the first global ground selection transistor of the first NAND string to the second global ground selection transistor of the second NAND string.

5. The nonvolatile memory device of claim 1, further comprising:
a first word line electrically connecting the first and second memory cells.

6. The nonvolatile memory device of claim 5, wherein the first word line electrically connects one of the first memory cells and one of the second memory cells at a common height.

7. The nonvolatile memory device of claim 1, further comprising:
a selection line driver configured to selectively provide a bias voltage to the first and second selection lines.

8. The nonvolatile memory device of claim 7, wherein the selection line driver includes first and second path transistors, the first selection line being connected to the first path transistor and the second selection line being connected to the second path transistor.

9. A nonvolatile memory device comprising:
first memory cells between a first ground selection transistor and a first string selection transistor stacked on a substrate,
a threshold voltage of the first ground selection transistor being higher than a threshold voltage of the first string selection transistor;
second memory cells between a second ground selection transistor and a second string selection transistor and stacked on the substrate,
a threshold voltage of the second ground selection transistor being higher than a threshold voltage of the second string selection transistor;
a first path transistor configured to provide an operation voltage to the first string selection transistor and the first ground selection transistor; and
a second path transistor configured to provide the operation voltage to the second string selection transistor and the second ground selection transistor.

10. The nonvolatile memory device of claim 9, further comprising:
a plurality of word lines connected to the first memory cells and the second memory cells; and
a driving circuit including the first and the second path transistors, wherein
the driving circuit is configured to provide a power supply voltage and a read voltage to at least one of the first memory cells and at least one of the second memory cells through an unselected word line of the plurality of word lines, and
the threshold voltage of the first ground selection transistor is higher than the power supply voltage and lower than the read voltage provided to the unselected word line.

11. The nonvolatile memory device of claim 9, further comprising:
a plurality of word lines connected to the first memory cells and the second memory cells; and
a driving circuit including the first and the second path transistors, wherein
the driving circuit is configured to provide a power supply voltage and a read voltage to at least one of the first memory cells and at least one of the second memory cells through an unselected word line of the plurality of word lines, and
the threshold voltage of the second ground selection transistor is higher than the power supply voltage and lower than the read voltage provided to the unselected word line.

12. The nonvolatile memory device of claim 9, wherein the first ground selection transistor is configured to be turned off at a program operation.

13. The nonvolatile memory device of claim 9, wherein the first string selection transistor is configured to be turned on at a program operation.

* * * * *